US006338409B1

United States Patent
Neary

(10) Patent No.: US 6,338,409 B1
(45) Date of Patent: Jan. 15, 2002

(54) RETICLE SMIF POD IN SITU ORIENTATION

(75) Inventor: Timothy E. Neary, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/548,174

(22) Filed: Apr. 13, 2000

(51) Int. Cl.[7] .............................................. B65D 85/00
(52) U.S. Cl. ...................................... 206/710; 206/454
(58) Field of Search ................................. 206/434, 710, 206/722, 560; 414/936, 940, 217.1, 292

(56) References Cited

U.S. PATENT DOCUMENTS

| 4,706,161 A | * 11/1987 | Buckingham ............... 206/722 |
| 4,757,355 A | 7/1988 | Iizuka et al. |
| 4,832,612 A | * 5/1989 | Grabbe et al. .............. 206/710 |
| 5,314,068 A | * 5/1994 | Nakazato et al. ........... 206/454 |
| 5,482,161 A | 1/1996 | Williams et al. |
| 5,713,711 A | 2/1998 | McKenna et al. |
| 5,740,845 A | 4/1998 | Bonora et al. |
| 5,896,729 A | * 4/1999 | Bell et al. .................... 206/525 |

FOREIGN PATENT DOCUMENTS

| JP | 3-93250 | 4/1991 |
| JP | 93-040416/05 | 6/1991 |
| JP | 3-87524 | 10/1992 |
| JP | 92-365348 | 12/1992 |

\* cited by examiner

*Primary Examiner*—Shian Luong
(74) *Attorney, Agent, or Firm*—Wood, Phillips, VanSanten, Clark & Mortimer

(57) ABSTRACT

A reticle SMIF pod for in situ orientation comprises a pod door. A pod cover is removably receivable on the door to define an interior space. A nest assembly has a plate resting on the pod door in the interior space and a core extending downwardly from the plate through an opening in the pod door. The plate is rotatably mounted on the pod door to selectively orient a reticle supported on the plate, in use. Alignment legs or tabs align the plate relative to the pod door in one of plural orthogonal positions.

20 Claims, 2 Drawing Sheets

RETICLE SMIF POD IN SITU ORIENTATION

FIELD OF THE INVENTION

The present invention relates to a SMIF pod and more particularly, to reticle SMIF pod in situ orientation.

BACKGROUND OF THE INVENTION

Semiconductor devices must be manufactured in a clean environment. Steps must therefore be taken to ensure that dust and other particles on semiconductor wafers or reticles are minimized. Thus, much of the processing is done in sealed rooms and/or chambers. Steps must also be taken to control the environment during transportation of the wafers and/or reticles. This is typically accomplished using a standardized mechanical interface (SMIF) system.

A SMIF system typically uses a SMIF pod including a door and cover sealed together to define an interior space. The wafers and/or reticles are stored and transported in the interior space. When using a bottom-opening 200-millimeter SMIF pod the reticle is located in the pod by conventional process tools. If the process creates a latent image to allow orientation of the reticle then it is easy to orient the reticle prior to placement in the pod for subsequent processing. If no such image is available, then orientation is not possible. Conventional systems require standalone orientation stations that use a robot or indexer to manipulate the reticle orientation.

The present invention is directed to solving one or more of the problems discussed above, in a novel and simple manner.

SUMMARY OF THE INVENTION

In accordance with the invention, there is provided a SMIF pod providing in situ orientation.

Broadly, there is disclosed herein a SMIF pod comprising a pod door. A pod cover is removably receivable on the door to define an interior space. A nest assembly has a plate resting on the pod door in the interior space and a core extending downwardly from the plate through an opening in the pod door. The plate is rotatably mounted on the pod door to selectively orient a workpiece supported on the plate, in use. Alignment means align the plate relative to the pod door in one of plural orthogonal positions.

It is a feature of the invention that the pod door comprises an upper door plate and a lower door plate and a latch mechanism disposed therebetween for latching the pod door to the pod cover.

It is another feature of the invention that the alignment means comprises an alignment leg extending downwardly from the plate and plural spaced apart bores in the pod door for selectively receiving the alignment leg.

It is a further feature of the invention that the alignment means comprises plural alignment legs extending downwardly from the plate and plural spaced apart bores in the pod door each for receiving one of the alignment legs.

It is an additional feature of the invention that the alignment means comprises a locking tab extending radially from the core and plural seats orthogonally positioned in the door for selectively receiving the locking tab.

It is still another feature of the invention that the alignment means comprises plural orthogonally spaced locking tabs extending radially from the core and plural seats orthogonally positioned in the door each for receiving one of the locking tabs.

It is still a further feature of the invention to provide means for biasing the plate downwardly against the pod door. The nest assembly comprises a flange on the core. The biasing means comprises a retaining spring disposed between the pod door and the flange. The pod door comprises an upper door plate and a lower door plate and the flange is sandwiched between the upper door plate and the lower door plate.

It is still yet another feature of the invention that the core includes a downwardly facing groove for actuation by an external engagement device to effect rotation of the plate.

Further features and advantage of the invention will be readily apparent from the specification and from the drawings.

DETAILED DESCRIPTION OF THE INVENTION

Figure 1:
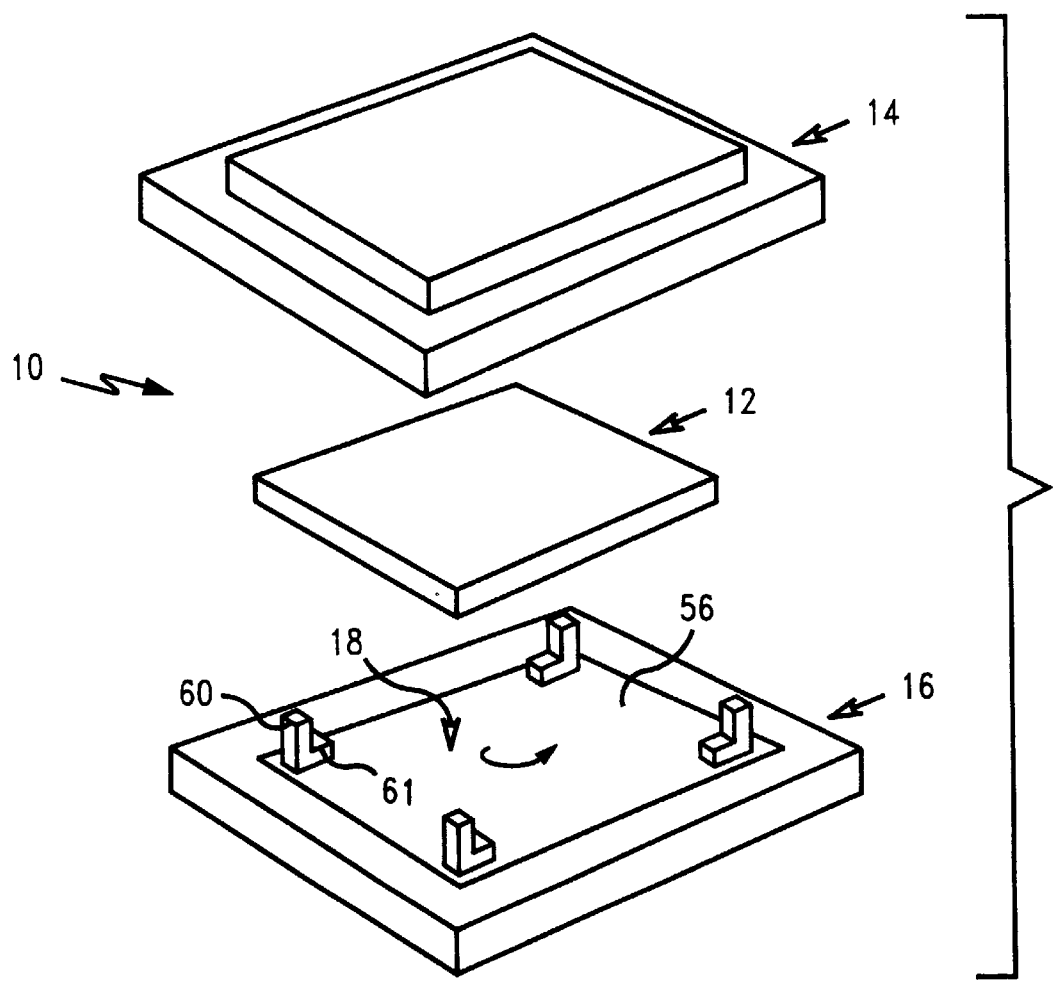
FIG. 1 is an exploded perspective view of a reticle SMIF pod providing in situ orientation in accordance with the invention.
Figure 2:
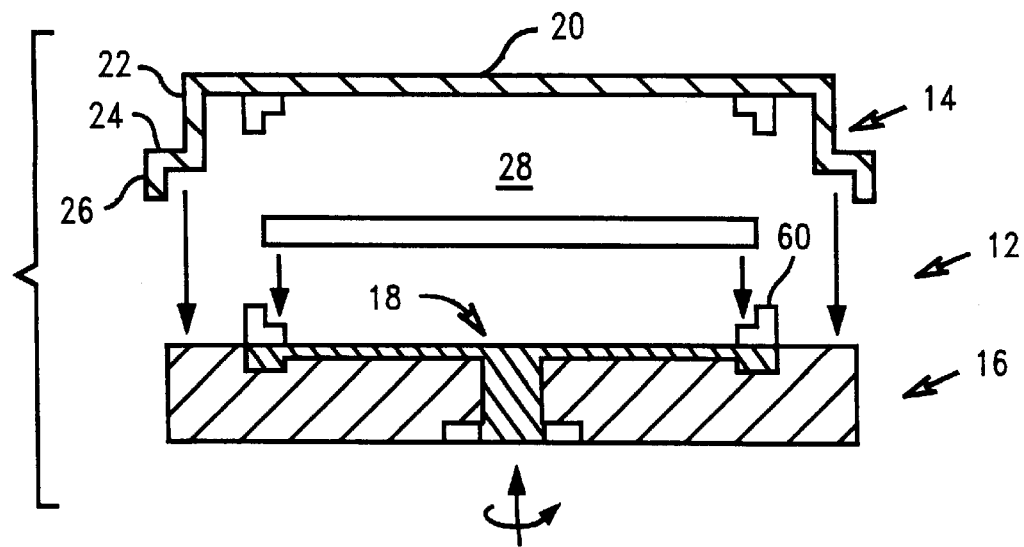
FIG. 2 is a side sectional exploded view of the SMIF pod of FIG. 1.

Referring to FIGS. 1 and 2, a standardized mechanical interface (SMIF) pod 10 for use in a conventional SMIF system (not shown) is illustrated. The SMIF pod 10 is adapted to provide in situ orientation of a workpiece, such as a reticle 12 or semiconductor wafer (not shown), supported therein.

The SMIF pod 10 includes a cover 14, a door 16 and a nesting assembly 18. As is known, the reticle 12 is a sheet of glass or the like configured as a mask for a semiconductor chip. As such, the reticle 12 has a lithography pattern thereon representing the devices at one level to be fabricated on a semiconductor wafer. In the illustrated embodiment of the invention, the reticle 12 is a six-inch by six-inch by 0.25 inch plate of glass. As is apparent, the reticle could be larger or smaller, as necessary for a particular application.

While the SMIF pod 10 is described in connection with in situ orientation for the reticle 12, the SMIF pod 10 could likewise be adapted to support semiconductor wafers or the like. Likewise, the SMIF pod 10 could be adapted to support shapes other than the square reticle 12 illustrated.

The pod cover 14 is of conventional construction including an upper square wall 20 surrounded by a downwardly extending perimeter wall 22. The perimeter wall 22 is in turn connected to an outwardly extending flange 24 which is also surrounded by a downwardly extending lower perimeter wall 26. The door 16 is likewise of conventional construction and is of square shape. The cover lower perimeter wall 26 is of a size to be received on the pod door 16 to define a sealed interior space 28 when fully assembled. Although not shown herein, the pod door 16 and pod cover 14 include latching structure for latching the door 16 in the cover 14 to close and seal the interior space 28. The underside of the door 16 includes a pair of oval slots 30 on either side of a center line, see FIG. 4. These provide access to engagement holes 32 in a latching mechanism 34, see FIG. 3, associated with the latching structure to selectively open the door 16 in a normal manner.

The pod door 16 includes an upper door plate 36 and a lower door plate 38. The latching mechanism 34 is sandwiched between the upper door plate 36 and the lower door plate 38 in a recess 40 provided in the upper door plate.

The upper door plate 36 includes a centrally located through opening 42. A downwardly opening counter-bore 44 is coaxial with the through opening 42. The lower door plate 38 includes a centrally located through opening 46 and an upwardly opening counter-bore 48 coaxial with the through opening 46. The lower door plate counter-bore 48 is of a larger size than the upper door counter-bore 44. Four orthogonally spaced alignment slots 50 are provided in the lower door plate 38 surrounding the opening 46.

Figure 3:
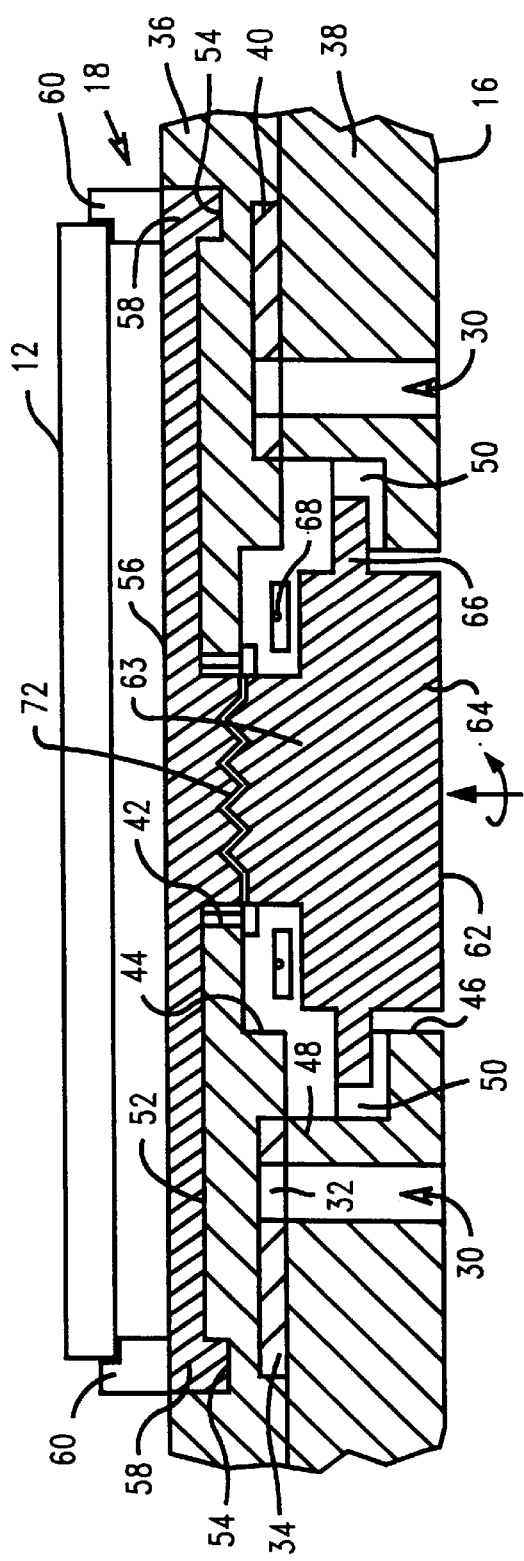
FIG. 3 is a detailed sectional view illustrating an alignment means for the SMIF pod of FIG. 1.
Figure 4:
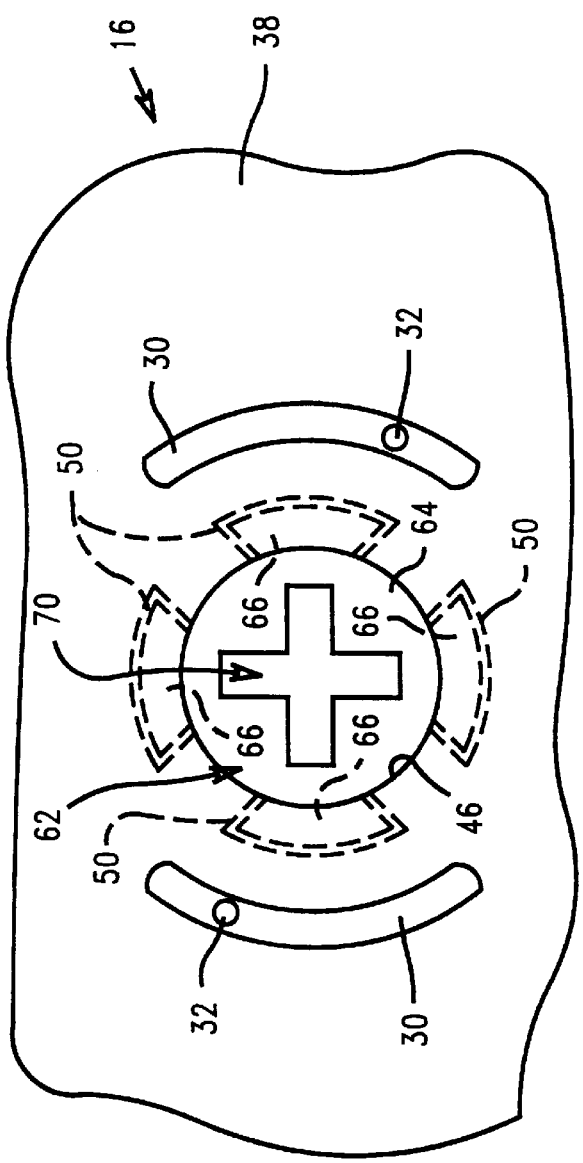
FIG. 4 is a partial, bottom plan view illustrating the alignment means of FIG. 3.

The upper door plate 36 includes a generally rectangular upwardly opening cavity 52 of a size and shape for receiving the nesting assembly 18. Four spaced apart bores 54, two of which are shown in FIG. 3, are located near the periphery of the cavity 52 for alignment of the nesting assembly, as discussed below.

The nesting assembly 18 comprises a plate 56 for resting on the upper door plate 36 in the cavity 52. Four alignment legs 58 extend downwardly from a periphery of the plate 56 each to be received in one of the bores 54 for alignment of the plate 56. Four corner posts 60 extend upwardly from each corner of the plate 56. Each corner post 60 is provided with a shoulder 61 for receiving and supporting the reticle 12.

The nesting assembly 18 further comprises a core 62 extending downwardly from the plate 56. The core 62 includes a neck 63 extending through the upper door plate opening 42 and an enlarged head or flange 64 receivable in the lower door plate central opening 46. Four locking tabs 66 extend radially from the core flange 64 and are selectively received in the seats 50. A retaining spring 68 is captured between the core flange 64 and the upper plate counter-bore 44, surrounding the neck 63, to bias the nesting assembly 18 downwardly with the locking tab 66 in the seats 50. The retaining spring 60 may comprise, for example, a spring washer.

The core 62 includes a downwardly facing groove 70 for actuation by an external engagement device to effect rotation of the nesting assembly 18, as described below, for orienting the reticle 12. In the illustrated embodiment of the invention, the groove 70 is a cross hair groove in the configuration of a "+" sign.

In use, with a reticle 12 supported on the nesting assembly 18, in situ orientation can be provided using the SMIF pod 10 in accordance with the invention. This is done with the SMIF pod in a suitable processing tool and the door 16 open. An external engagement tool (not shown) is used to engage the core slot 70. The core 62 is pushed upwardly against the force of the spring 68 until the locking tabs 66 clear the slots 50 and the alignment legs 58 clear the bores 54. The external engagement device is then rotated to in turn rotate the core 62 to a select desired orientation in 90-degree increments. Alignment of the plate 56 relative to the door 16 is provided by the relationship between the locking tab 66 and seats 50 and the relationship between the alignment legs 58 and the bores 54. As such, once the nesting assembly is rotated to a desired orthogonal position and the tab 66 and alignment legs 58 are properly aligned, then the external engagement device can retract with the spring 68 returning the nesting assembly 18 to its operative position.

In the illustrated embodiment of the invention, four locking tabs 66 are used with four seats 50. As is apparent, the SMIF pod 10 could use more or less locking tabs and seats according to the number of orthogonal alignment positions to be used. Likewise, a single locking tab could be used for selectively locking with one of plural seats. Also, more or less than four alignment legs 58 and bores 44 could be used for alignment purposes. Likewise, a single alignment leg could be used with plural alignment bores.

In the illustrated embodiment of the invention, the nesting assembly 88 is a two-piece unit. The core 62 is broken as indicated at 72 to facilitate assembly and attached with a suitable adhesive compound or the like. Thereafter, the nesting assembly 38 becomes a permanent fixture on the door 16.

The SMIF pod 10 includes alignment means in two different locations. The first is the alignment legs 58 and the second is the locking tabs 66. In accordance with the invention, either one or both of the alignment means could be utilized.

Thus, the SMIF pod 10 provides improvements in manufacturing process by allowing in situ orientation of a reticle and/or wafer. Once the orientation process is completed, the normal manufacturing processes can continue. The manufacturing process could also be automated to teach the tool to do the orientation by itself. Applications where the SMIF pod 10 could be utilized include, for example, a plasma therm-etched tool for endpoint detection, KLA for inspection, Micron for repair, Nikon for pellicle mount, and Write for notch orientation. The SMIF pod 10, as discussed above, eliminates the stand alone orientation stations for these applications.

I claim:

1. A SMIF pod comprising:
   a pod door;
   a pod cover removably receivable on the door to define an interior space;
   a nest assembly having a plate resting on the pod door in the interior space and a core extending downwardly from the plate through an opening in the pod door, whereby the plate is rotatably mounted on the pod door to selectively orient a workpiece supported on the plate, in use; and
   alignment means for aligning the plate relative to the pod door in one of plural orthogonal positions.

2. The SMIF pod of claim 1 wherein the pod door comprises an upper door plate and a lower door plate and a latch mechanism disposed therebetween for latching the pod door to the pod cover.

3. The SMIF pod of claim 1 wherein the alignment means comprises an alignment leg extending downwardly from the plate and plural spaced apart bores in the pod door for selectively receiving the alignment leg.

4. The SMIF pod of claim 1 wherein the alignment means comprises plural alignment legs extending downwardly from the plate and plural spaced apart bores in the pod door each for receiving one of the alignment legs.

5. The SMIF pod of claim 1 wherein the alignment means comprises a locking tab extending radially from the core and plural seats orthogonally positioned in the door for selectively receiving the locking tab.

6. The SMIF pod of claim 1 wherein the alignment means comprises plural orthogonally spaced locking tabs extending radially from the core and plural seats orthogonally positioned in the door each for receiving one of the locking tabs.

7. The SMIF pod of claim 1 further comprising means for biasing the plate downwardly against the pod door.

8. The SMIF pod of claim 7 wherein the nest assembly further comprises a flange on the core, and the biasing means comprises a retaining spring disposed between the pod door and the flange.

9. The SMIF pod of claim 8 wherein the pod door comprises an upper door plate and a lower door plate and the flange is sandwiched between the upper door plate and the lower door plate.

10. The SMIF pod of claim 9 wherein the alignment means comprises plural orthogonally spaced locking tabs extending radially from the core and plural seats orthogonally positioned in the lower door plate each for receiving one of the locking tabs.

11. The SMIF pod of claim 1 wherein the core includes downwardly facing groove for actuation by an external engagement device to effect rotation of the plate.

12. A SMIF pod comprising:

a pod door;

a pod cover removably receivable on the door to define an interior space;

a nest assembly having a plate resting on the pod door in the interior space and a core extending downwardly from the plate through an opening in the pod door, whereby the plate is rotatably mounted on the pod door to selectively orient a workpiece supported on the plate, in use; and an alignment member operatively associated with the nest assembly for selectively engaging with an alignment element ofthe pod door for aligning the plate relative to the pod door in one of plural orthogonal positions.

13. The SMIF pod of claim 12 wherein the alignment member comprises an alignment leg extending downwardly from the plate and the alignment element comprises plural spaced apart bores in the pod door for selectively receiving the alignment leg.

14. The SMIF pod of claim 12 wherein the alignment member comprises plural alignment legs extending downwardly from the plate and the alignment element comprises plural spaced apart bores in the pod door each for receiving one of the alignment legs.

15. The SMIF pod of claim 12 wherein the alignment member comprises a locking tab extending radially from the core and the alignment element comprises plural seats orthogonally positioned in the door for selectively receiving the locking tab.

16. The SMIF pod of claim 12 wherein the alignment member comprises plural orthogonally spaced locking tabs extending radially from the core and the alignment element comprises plural seats orthogonally positioned in the door each for receiving one of the locking tabs.

17. The SMIF pod of claim 12 further comprising means for biasing the plate downwardly against the pod door.

18. The SMIF pod of claim 17 wherein the nest assembly further comprises a flange on the core, and the biasing means comprises a retaining spring disposed between the pod door and the flange.

19. The SMIF pod of claim 18 wherein the pod door comprises an upper door plate and a lower door plate and the flange is sandwiched between the upper door plate and the lower door plate.

20. The SMIF pod of claim 19 wherein the alignment member comprises plural orthogonally spaced locking tabs extending radially from the core and the alignment element comprises plural seats orthogonally positioned in the lower door plate each for receiving one of the locking tabs.

\* \* \* \* \*